United States Patent
Tseng et al.

(10) Patent No.: US 9,510,464 B2
(45) Date of Patent: Nov. 29, 2016

(54) MANUFACTURING METHOD OF CIRCUIT BOARD

(75) Inventors: Tzyy-Jang Tseng, Hsinchu (TW); Shu-Sheng Chiang, Taipei (TW); Tsung-Yuan Chen, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 655 days.

(21) Appl. No.: 13/590,815

(22) Filed: Aug. 21, 2012

(65) Prior Publication Data
US 2012/0318770 A1 Dec. 20, 2012

Related U.S. Application Data

(62) Division of application No. 12/785,725, filed on May 24, 2010, now Pat. No. 8,450,623.

(30) Foreign Application Priority Data

Dec. 30, 2009 (TW) .................. 98145817 A

(51) Int. Cl.
| | |
|---|---|
| H05K 3/46 | (2006.01) |
| H05K 3/04 | (2006.01) |
| H05K 3/10 | (2006.01) |
| C23C 18/16 | (2006.01) |
| H05K 1/02 | (2006.01) |
| H05K 3/00 | (2006.01) |

(52) U.S. Cl.
CPC ........... *H05K 3/465* (2013.01); *C23C 18/1612* (2013.01); *C23C 18/1651* (2013.01); *C23C 18/1653* (2013.01); *C23C 18/1689* (2013.01); *H05K 3/045* (2013.01); *H05K 1/0265* (2013.01); *H05K 3/0032* (2013.01); *H05K 3/0035* (2013.01); *H05K 3/107* (2013.01); *H05K 2201/0391* (2013.01); *H05K 2201/09509* (2013.01); *Y10T 29/49155* (2015.01); *Y10T 29/49165* (2015.01)

(58) Field of Classification Search
CPC .. H05K 3/045; H05K 3/0032; H05K 3/0035; H05K 3/107; H05K 3/42–3/429; H05K 3/465; H05K 2201/09509; H05K 2201/0391; Y10T 29/49155; Y10T 29/49165
See application file for complete search history.

(56) References Cited

U.S. PATENT DOCUMENTS

| | | | |
|---|---|---|---|
| 8,217,278 B2 * | 7/2012 | Yu | 174/262 |
| 8,322,032 B2 * | 12/2012 | Lee | 29/852 |
| 2008/0041621 A1 * | 2/2008 | Hsu et al. | 174/262 |

FOREIGN PATENT DOCUMENTS

| | | |
|---|---|---|
| TW | 566796 | 12/2003 |
| TW | I230427 | 4/2005 |
| TW | 200930162 | 7/2009 |

OTHER PUBLICATIONS

"Office Action of Taiwan counterpart application" issued on Oct. 24, 2012, p. 1-p. 7, in which the listed references were cited.

*Primary Examiner* — Livius R Cazan

(74) *Attorney, Agent, or Firm* — J.C. Patents

(57) ABSTRACT

A manufacturing method of a circuit board is provided. A circuit substrate having a first surface and at least a first circuit is provided. A dielectric layer having a second surface and covering the first surface and the first circuit is formed on the circuit substrate. The dielectric layer is irradiated by a laser beam to form a first intaglio pattern, a second intaglio pattern and at least a blind via. A first conductive layer is formed in the first intaglio pattern, the second intaglio pattern and the blind via. A barrier layer and a second conductive layer are formed in the second intaglio pattern and the blind via. Parts of the second conductive layer, parts of the barrier layer and parts of the first conductive layer are removed until the second surface of the dielectric layer is exposed, so as to form a patterned circuit structure.

12 Claims, 9 Drawing Sheets

MANUFACTURING METHOD OF CIRCUIT BOARD

CROSS-REFERENCE TO RELATED APPLICATION

This application is a Divisional of and claims the priority benefit of U.S. patent application Ser. No. 12/785,725, filed on May 24, 2010, now U.S. Pat. No. 8,450,623, which claims the priority benefits of Taiwan application Serial No. 98145817, filed on Dec. 30, 2009. The entirety of the above-mentioned patent applications is hereby incorporated by reference herein and made a part of specification.

BACKGROUND OF INVENTION

1. Field of Invention

The invention relates to a circuit board and a manufacturing method thereof. More particularly, the invention relates to both a circuit board in which a circuit layer includes circuits formed by different conductive layers and a manufacturing method of the circuit board.

2. Description of Related Art

With current development of the circuit board technology, well-known non-embedded circuit boards have been gradually replaced by embedded circuit boards. Specifically, the common non-embedded circuit board is characterized in that circuits therein are protruded from a surface of a dielectric layer, while circuits in an embedded circuit board are embedded into the dielectric layer. The circuit structure of a circuit board is often formed by performing a photolithography and etching process or a laser ablating process.

For instance, a conventional process for fabricating a build-up circuit structure of an embedded circuit board by laser ablating includes following steps. A dielectric layer is formed on a circuit substrate having a circuit layer. A surface of the dielectric layer is irradiated by a laser beam to form an intaglio pattern and a blind via connecting the circuit layer. An electroplating process is performed to form a conductive layer filling the blind via and the intaglio pattern. So far, the build-up circuit structure of the embedded circuit board is substantially formed.

The depth of the blind via is different from the depth of the intaglio pattern, which is likely to cause improper control of electroplating conditions. Accordingly, when the conductive layer is formed by performing the electroplating process, the thickness of the conductive layer is apt to be non-uniform. When the conductive layer located outside the intaglio pattern and the blind via is subsequently removed, it is difficult to control the thickness of the removed conductive layer. As such, the embedded conductive layer is likely to be inappropriately thinned, or the residual conductive material is prone to be inappropriately left on the dielectric layer. In addition, when a build-up circuit layer is subsequently formed on the dielectric layer, problems of undesirable quality and low yield may occur in the electroplating process, thus reducing manufacturing yield of the build-up circuit structure and deteriorating reliability of the circuit board.

SUMMARY OF INVENTION

The invention is directed to a circuit board and a manufacturing method thereof. In the circuit board, a circuit layer includes at least a second circuit (i.e. a fine circuit) and a plurality of third circuits (i.e. normal circuits). The second circuit is formed by a single conductive layer, while the third circuits are formed by different conductive layers.

In the invention, a circuit board including a circuit substrate, a dielectric layer, and a patterned circuit structure is provided. The circuit substrate has a first surface and at least a first circuit. The dielectric layer is disposed on the circuit substrate and covers the first surface and the first circuit. The dielectric layer has a second surface, at least a blind via extending from the second surface to the first circuit, a first intaglio pattern, and a second intaglio pattern. The patterned circuit structure includes at least a second circuit and a plurality of third circuits. The second circuit is disposed in the first intaglio pattern. The third circuits are disposed in the second intaglio pattern and the blind via. Each of the third circuits has a first conductive layer, a second conductive layer, and a barrier layer. The first conductive layer is located between the barrier layer and the second intaglio pattern and between the barrier layer and the blind via. The second conductive layer covers the barrier layer. A material of the first conductive layer is substantially the same as a material of the second circuit, and a line width of the second circuit is smaller than a line width of each of the third circuits. At least one of the third circuits is electrically connected to the first circuit of the circuit substrate.

According to an embodiment of the invention, the first circuit is embedded into the circuit substrate, and a surface of the first circuit and the first surface are substantially aligned.

According to an embodiment of the invention, the first circuit is disposed on the first surface of the circuit substrate.

According to an embodiment of the invention, a material of the dielectric layer includes polymer.

According to an embodiment of the invention, a material of the polymer is selected from the group consisting of epoxy resin, modified epoxy resin, polyester, acrylate, fluoro-polymer, polyphenylene oxide, polyimide, phenolicresin, polysulfone, silicone polymer, bismaleimide triazine modified epoxy resin (BT resin), ajinomoto build-up film (ABF) resin, polypropylene (PP) resin, cyanate ester, polyethylene, polycarbonate (PC), acrylonitrile-butadiene-styrene (ABS) copolymer, polyethylene terephthalate (PET) resin, polybutylene terephthalate (PBT) resin, liquid crystal polymer (LCP), polyamide 6 (PA 6), nylon, polyoxymethylene (POM), polyphenylene sulfide (PPS), and cyclic olefin copolymer (COC).

According to an embodiment of the invention, a material of the barrier layer is different from the material of the second circuit, the material of the first conductive layer, and a material of the second conductive layer.

According to an embodiment of the invention, the second circuit is a chemical copper layer.

According to an embodiment of the invention, the first conductive layer is a chemical copper layer.

According to an embodiment of the invention, a material of the barrier layer includes nickel, tin, chromium, aluminum, zinc, or gold.

According to an embodiment of the invention, the second conductive layer is an electroplated copper layer.

According to an embodiment of the invention, the second intaglio pattern and the blind via are connected.

In this invention, a manufacturing method of a circuit board is further provided. In the manufacturing method, a circuit substrate is provided. The circuit substrate has a first surface and at least a first circuit. A dielectric layer is formed on the circuit substrate. The dielectric layer has a second surface and covers the first surface and the first circuit. The dielectric layer is irradiated by a laser beam to form a first intaglio pattern, a second intaglio pattern, and at least a blind via extending from the second surface of the dielectric layer to the first circuit. A first conductive layer is formed in the first intaglio pattern, the second intaglio pattern, and the blind via. A barrier layer is formed in the second intaglio pattern and the blind via, and the barrier layer covers the first conductive layer. A second conductive layer is formed in the second intaglio pattern and the blind via, and the second conductive layer covers the barrier layer. Parts of the second conductive layer, parts of the barrier layer, and parts of the first conductive layer are removed until the second surface of the dielectric layer is exposed, so as to form a patterned circuit structure. The patterned circuit structure is located in the first intaglio pattern, the second intaglio pattern, and the blind via. Besides, the patterned circuit structure is electrically connected to the first circuit of the circuit substrate.

According to an embodiment of the invention, the first circuit is embedded into the circuit substrate, and a surface of the first circuit and the first surface are substantially aligned.

According to an embodiment of the invention, the first circuit is disposed on the first surface of the circuit substrate.

According to an embodiment of the invention, a material of the dielectric layer includes polymer.

According to an embodiment of the invention, a material of the polymer is selected from the group consisting of epoxy resin, modified epoxy resin, polyester, acrylate, fluoro-polymer, polyphenylene oxide, polyimide, phenoli-cresin, polysulfone, silicone polymer, BT resin, ABF resin, PP resin, cyanate ester, polyethylene, PC, ABS copolymer, PET resin, PBT resin, LCP, PA 6, nylon, POM, PPS, and COC.

According to an embodiment of the invention, the laser beam is an infrared laser source or an ultraviolet laser source.

According to an embodiment of the invention, a method of forming the first conductive layer includes performing an electroless plating process.

According to an embodiment of the invention, the first conductive layer is a chemical copper layer.

According to an embodiment of the invention, a method of forming the barrier layer includes sputtering or chemical deposition.

According to an embodiment of the invention, a material of the barrier layer includes nickel, tin, chromium, zinc, aluminum, or gold.

According to an embodiment of the invention, a method of forming the second conductive layer includes performing an electroplating process.

According to an embodiment of the invention, the second conductive layer is an electroplated copper layer.

According to an embodiment of the invention, the patterned circuit structure includes at least a second circuit and a plurality of third circuits. The second circuit is located in the first intaglio pattern. The third circuits are located in the second intaglio pattern and the blind via. A line width of the second circuit is smaller than a line width of each of the third circuits. At least one of the third circuits is electrically connected to the first circuit of the circuit substrate.

According to an embodiment of the invention, before the barrier layer is formed on the first conductive layer, the first intaglio pattern is filled with the first conductive layer to form the second circuit of the patterned circuit structure.

According to an embodiment of the invention, the step of removing the parts of the second conductive layer, the parts of the barrier layer, and the parts of the first conductive layer includes performing a first etching process to remove one of the parts of the second conductive layer until the barrier layer is exposed. A second etching process is performed to remove the parts of the barrier layer until the first conductive layer is exposed. A third etching process is performed to remove the parts of the first conductive layer and another one of the parts of the second conductive layer until the second surface of the dielectric layer is exposed.

According to an embodiment of the invention, before the second etching process is performed, the manufacturing method further includes performing a polishing process on the barrier layer.

According to an embodiment of the invention, the second intaglio pattern and the blind via are connected.

Based on the above, the first conductive layer is formed in the first intaglio pattern, the second intaglio pattern, and the blind via in the invention. The barrier layer and the second conductive layer are sequentially formed in the second intaglio pattern and the blind via, so as to form the circuits with three different conductive layers. Besides, during the etching processes, the barrier layer can act as an etching stop layer for removing parts of the second conductive layer, and the first conductive layer can act as an etching stop layer for removing parts of the barrier layer. As such, the manufacturing method of the circuit board can contribute to favorable manufacturing yield and reliability according to this invention.

It is to be understood that both the foregoing general descriptions and the detailed embodiments are exemplary and are, together with the accompanying drawings, intended to provide further explanation of technical features and advantages of the invention.

BRIEF DESCRIPTION OF DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
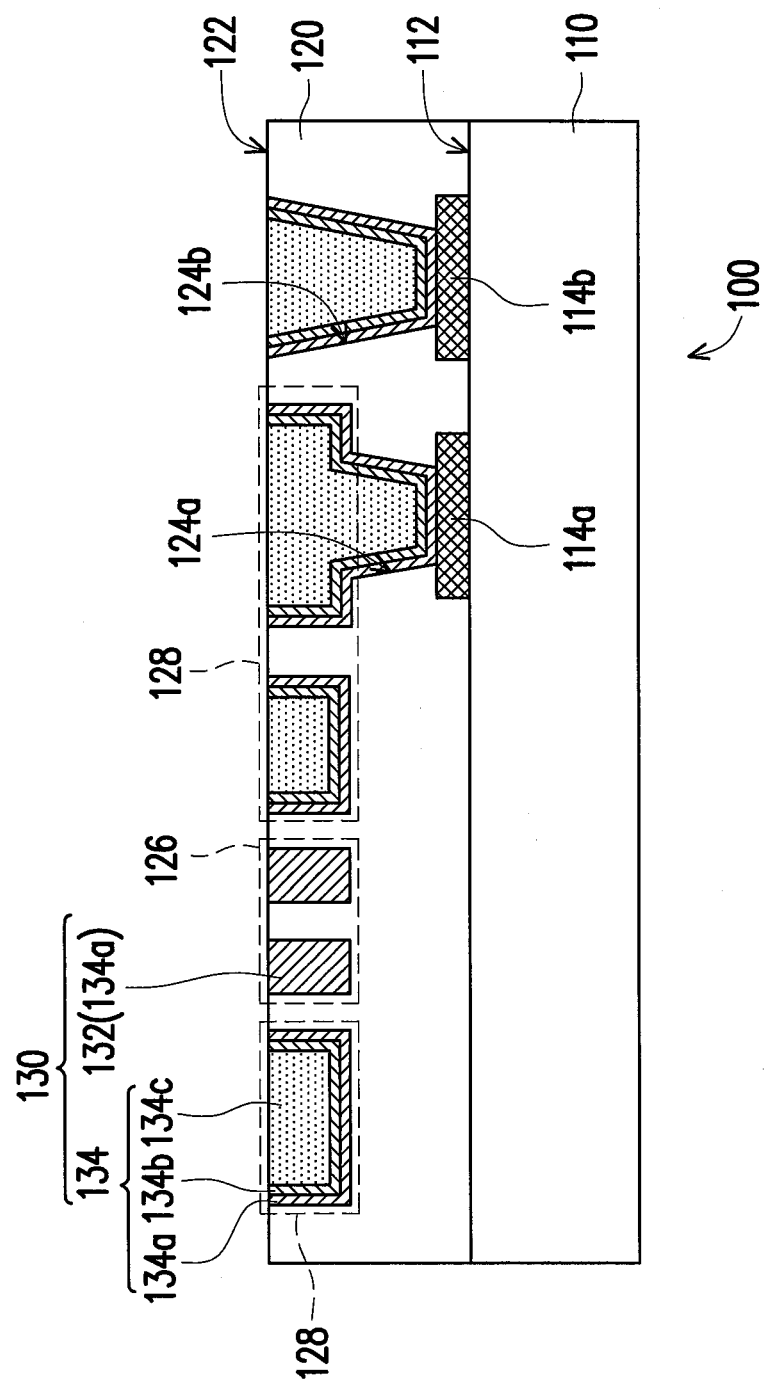
FIG. 1A is a schematic cross-sectional view illustrating a circuit board according to an embodiment of the invention.

FIG. 1A is a schematic cross-sectional view illustrating a circuit board according to an embodiment of the invention. As shown in FIG. 1A, in this embodiment, a circuit board 100 includes a circuit substrate 110, a dielectric layer 120, and a patterned circuit structure 130. It should be mentioned that the circuit board 100 can have a single circuit layer or multiple circuit layers. That is to say, the circuit board 100 can be a single layer circuit board, a double layer circuit board, or a multi-layer circuit board. In this embodiment, the circuit board 100 depicted in FIG. 1A is a build-up circuit board, for example.

Figure 1B:
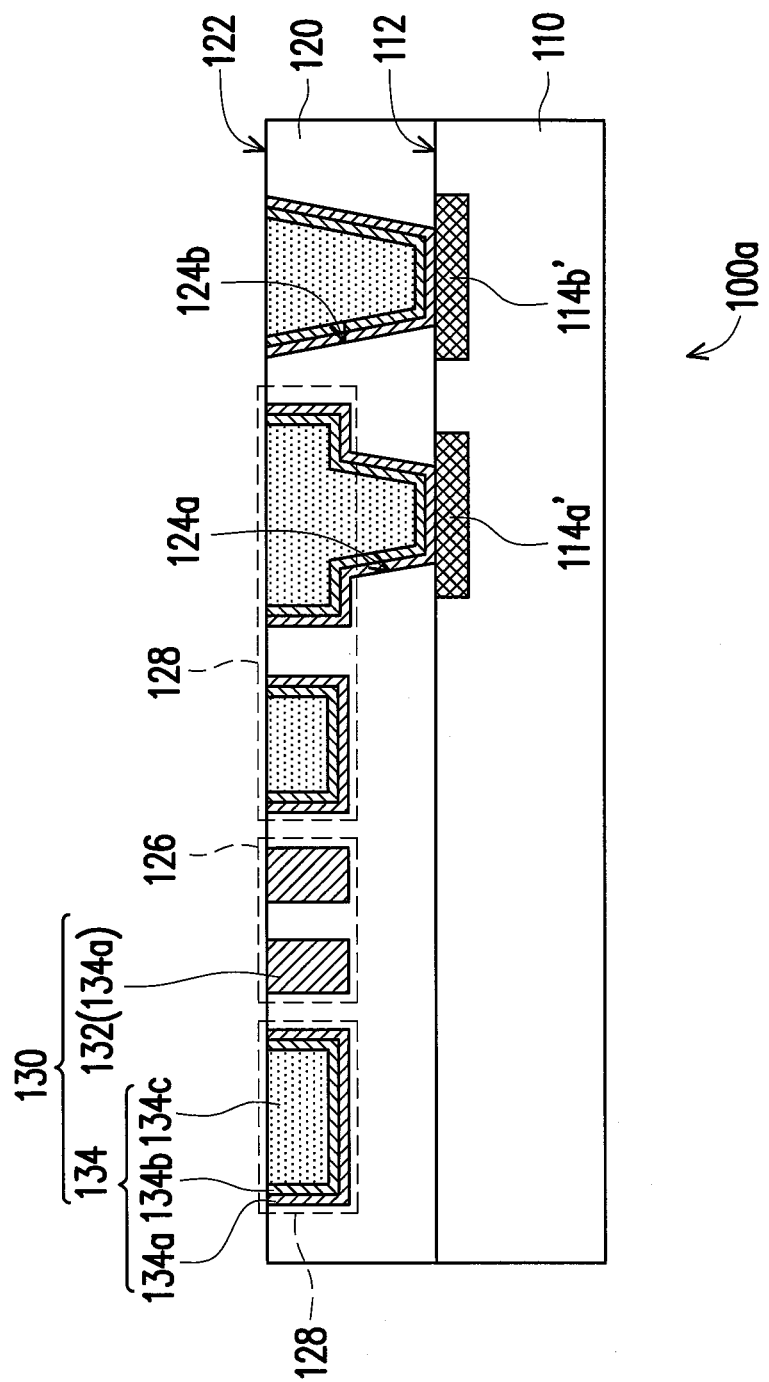
FIG. 1B is a schematic cross-sectional view illustrating a circuit board according to another embodiment of the invention.

Specifically, the circuit substrate 110 has a first surface 112 and at least a first circuit (two first circuits 114*a* and 114*b* are schematically depicted in FIG. 1A). The first circuits 114*a* and 114*b* are disposed on the first surface 112 of the circuit substrate 110. In other words, the first circuits 114*a* and 114*b* are normal circuits (i.e. non-embedded circuits). Note that the first circuits 114a and 114b are disposed on the first surface 112 of the circuit substrate 110 according to the embodiment depicted in FIG. 1A. However, in another embodiment shown in FIG. 1B, the first circuits 114a' and 114b' can also be embedded into the circuit substrate 110, and surfaces of the first circuits 114a' and 114b' and the first surface 112 are substantially aligned. Namely, the first circuits 114a' and 114b' are basically embedded circuits in another embodiment. The structure of the circuit substrate 110 depicted in FIG. 1A is merely exemplary, which should not be construed as limited to the embodiments of the invention set forth herein.

The dielectric layer 120 is disposed on the circuit substrate 110 and covers the first surface 112 and the first circuits 114a and 114b. The dielectric layer 120 has a second surface 122, at least a blind via extending from the second surface 122 to the first circuits 114a and 114b (two blind vias 124a and 124b are schematically shown in FIG. 1A), a first intaglio pattern 126, and a second intaglio pattern 128. The second intaglio pattern 128 is connected to the blind via 124a. In this embodiment, a material of the dielectric layer 120 is, for example, polymer. Here, the polymer is epoxy resin, modified epoxy resin, polyester, acrylate, fluoropolymer, polyphenylene oxide, polyimide, phenolicresin, polysulfone, silicone polymer, BT resin, ABF resin, PP resin, cyanate ester, polyethylene, PC, ABS copolymer, PET resin, PBT resin, LCP, PA 6, nylon, POM, PPS, COC, or any combination thereof.

The patterned circuit structure 130 includes at least a second circuit 132 (two second circuits 132 are schematically depicted in FIG. 1A) and a plurality of third circuits 134 (four third circuits 134 are schematically depicted in FIG. 1A). Here, a line width of the second circuit 132 is smaller than a line width of each of the third circuits 134. The second circuits 132 are disposed in the first intaglio pattern 126, and the second circuits 132 are, for example, chemical copper layers. The third circuits 134 are disposed in the second intaglio pattern 128 and the blind vias 124a and 124b. Here, the third circuits 134 located in the blind via 124a can be electrically connected to the first circuit 114a of the circuit substrate 110, and the third circuits 134 located in the blind via 124b can be electrically connected to the first circuit 114b of the circuit substrate 110.

In particular, each of the third circuits 134 has a first conductive layer 134a, a barrier layer 134b, and a second conductive layer 134c. The first conductive layer 134a is, for instance, a chemical copper layer, and the second conductive layer 134c is, for instance, an electroplated copper layer. Namely, a material of the first conductive layer 134a is substantially the same as a material of the second circuits 132. According to this embodiment, a material of the barrier layer 134b is different from that of the second circuits 132, that of the first conductive layer 134a, and that of the second conductive layer 134c. Here, the material of the barrier layer 134b is, for example, nickel, tin, chromium, zinc, aluminum, or gold. That is to say, the barrier layer 134b is a metal layer. Besides, the first conductive layer 134a is located between the barrier layer 134b and the second intaglio pattern 128 and between the barrier layer 134b and the blind vias 124a and 124b, and the second conductive layer 134c covers the barrier layer 134b. In other words, the third circuits 134 of this embodiment are made of three different conductive materials.

The second circuits 132 of this embodiment are disposed in the first intaglio pattern 126 of the dielectric layer 120, and the second circuits 132 and the first surface 122 of the dielectric layer 120 are substantially aligned. Namely, the second circuits 132 are basically embedded circuits in this embodiment. The third circuits 134 are disposed in the second intaglio pattern 128 of the dielectric layer 120 and in the blind vias 124a and 124b, and the third circuits 134 and the second surface 122 of the dielectric layer 120 are substantially aligned. Namely, the third circuits 134 are basically embedded circuits in this embodiment. Note that the second circuits 132 and the third circuits 134 in other embodiments that are not illustrated in the drawings may not be aligned with the second surface 122 of the dielectric layer 120 because of process errors, which should still fall within the scope of the invention and does not depart from the claims of the invention.

Particularly, in this embodiment, the line width of the second circuit 132 is smaller than the line width of each of the third circuits 134. That is to say, in comparison with the second circuits 132, the third circuits 134 are normal circuits. By contrast, the second circuits 132 are fine circuits. For instance, the line width of the second circuit 132 is smaller than 15 μm, while the line width of each of the third circuits 134 is greater than the line width of the second circuit 132. In other words, the line width of each of the third circuits 134 is more than 15 μm.

In short, the patterned circuit structure 130 of this embodiment includes the second circuits 132 having a single conductive layer (i.e. the first conductive layer 134a) and the third circuits 134 having several conductive layers (i.e. the first conductive layer 134a, the barrier layer 134b, and the second conductive layer 134c). The line width of the second circuit 132 is smaller than the line width of each of the third circuits 134. As such, the circuit board 100 of this embodiment can be equipped with the second circuits 132 having the single conductive layer (i.e. the fine circuits) and the third circuits 134 having three different conductive layers (i.e. the normal circuits) in one circuit layer.

Up to here, only the structure of the circuit board 100 of the invention is described, while a manufacturing method of the circuit board 100 of the invention is not yet provided. The manufacturing method of the circuit board 100 of the invention is elucidated hereinafter with reference to FIG. 2A to FIG. 2G. Note that the circuit board 100 depicted in FIG. 1A serves as an exemplary circuit board herein.

Figure 2A:
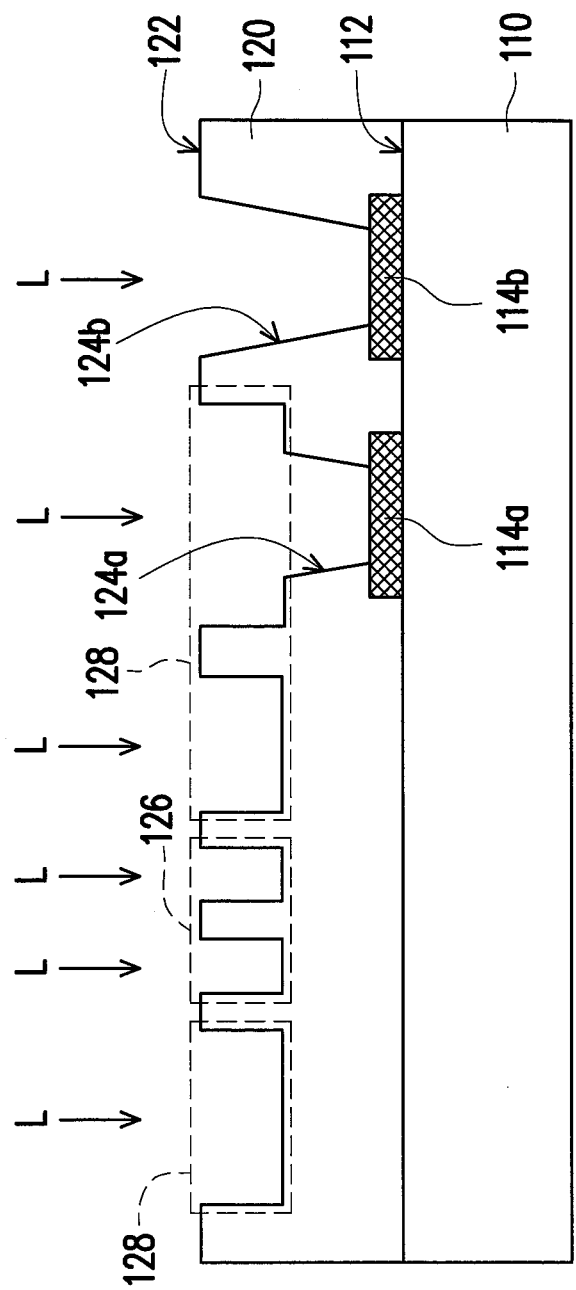
FIG. 2A to FIG. 2G are schematic cross-sectional views illustrating a manufacturing method of a circuit board according to an embodiment of the invention.

FIG. 2A to FIG. 2G are schematic cross-sectional views illustrating a manufacturing method of a circuit board according to an embodiment of the invention. As indicated in FIG. 2A, according to the manufacturing method of the circuit board 100 in the embodiment, a circuit substrate 110 is provided. The circuit substrate 110 has a first surface 112 and at least a first circuit (two first circuits 114a and 114b are schematically depicted in FIG. 1A). The first circuits 114a and 114b are disposed on the first surface 112 of the circuit substrate 110. Namely, the first circuits 114a and 114b are basically normal circuits (i.e. non-embedded circuits). Note that the first circuits 114a and 114b can also be embedded into the circuit substrate 110, and surfaces of the first circuits 114a and 114b and the first surface 112 are substantially aligned in other embodiments that are not illustrated in the drawings. Namely, the first circuits 114a and 114b are basically embedded circuits in other embodiments. The structure of the circuit substrate 110 depicted in FIG. 2A is merely exemplary, which should not be construed as limited to the embodiments of the invention set forth herein.

In FIG. 2A, a dielectric layer 120 is formed on the circuit substrate 110. The dielectric layer 120 has a second surface 122 and covers the first surface 112 and the first circuits 114a and 114b. In this embodiment, a material of the dielectric layer 120 is, for example, polymer, and the polymer is, for instance, epoxy resin, modified epoxy resin, polyester, acrylate, fluoro-polymer, polyphenylene oxide, polyimide, phenolicresin, polysulfone, silicone polymer, BT resin, ABF resin, PP resin, cyanate ester, polyethylene, PC, ABS copolymer, PET resin, PBT resin, LCP, PA 6, nylon, POM, PPS, COC, or any combination thereof.

In FIG. 2A, the dielectric layer 120 is irradiated by a laser beam L to form a first intaglio pattern 126, a second intaglio pattern 128, and at least a blind via extending from the second surface 122 of the dielectric layer 120 to the first circuits 114a and 114b. Note that two blind vias 124a and 124b are schematically illustrated in FIG. 2A. Here, the second intaglio pattern 128 is connected to the blind via 124a. According to this embodiment, the laser beam L is, for example, an infrared laser source or an ultraviolet laser source.

Figure 2B:
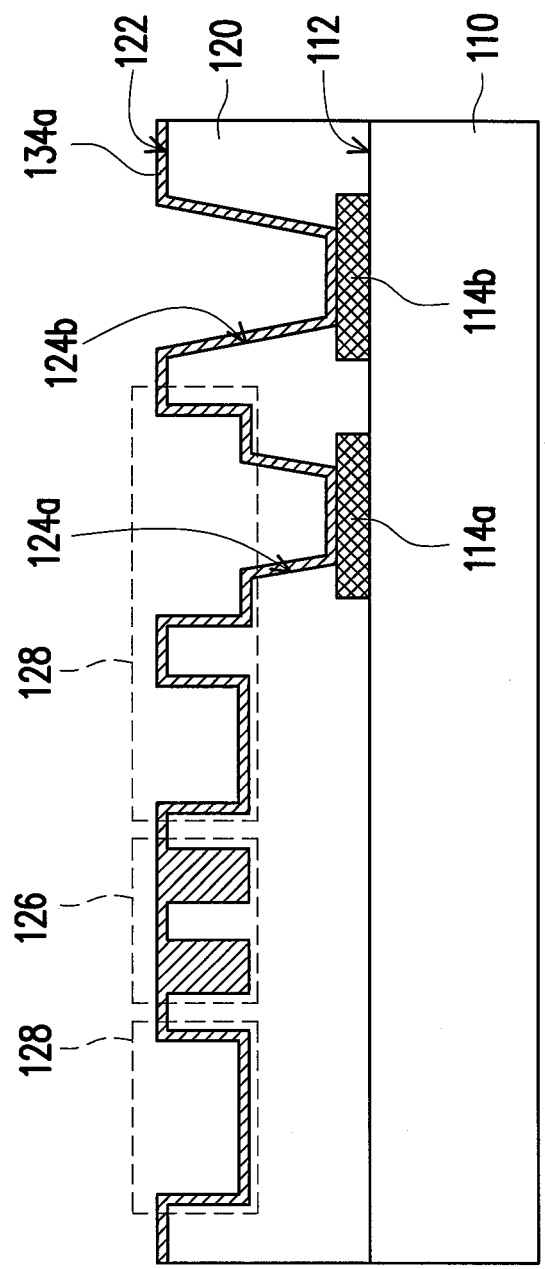

As indicated in FIG. 2B, a first conductive layer 134a is formed in the first intaglio pattern 126, the second intaglio pattern 128, and the blind vias 124a and 124b. To be more specific, the first intaglio pattern 126 is filled with the first conductive layer 134a, and the first conductive layer 134a is formed on an inner wall of the second intaglio pattern 128 and inner walls of the blind vias 124a and 124b. Additionally, a method of forming the first conductive layer 134a is, for example, performing an electroless plating process, and the first conductive layer 134a is, for instance, a chemical copper layer.

Figure 2C:
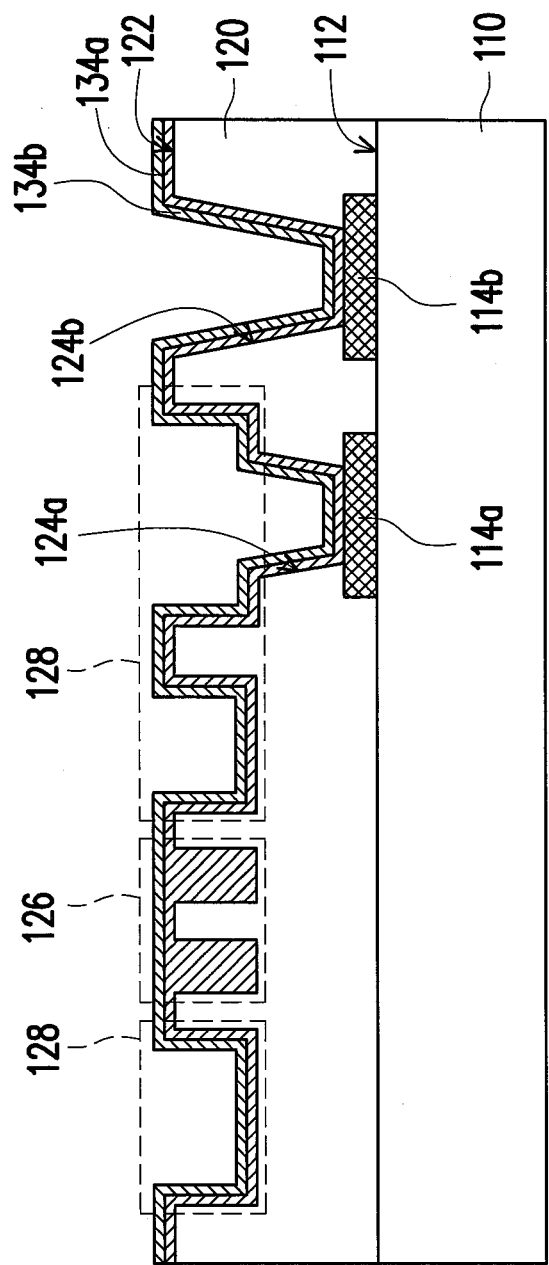

In FIG. 2C, a barrier layer 134b is formed in the second intaglio pattern 128 and the blind vias 124a and 124b, and the barrier layer 134b covers the first conductive layer 134a. In particular, the barrier layer 134b of this embodiment is conformably disposed on the first conductive layer 134a, and a method of forming the barrier layer 134b is, for example, sputtering or chemical deposition. Here, a material of the barrier layer 134b is, for example, nickel, tin, chromium, zinc, aluminum, or gold. That is to say, the barrier layer 134b is a metal layer.

Figure 2D:
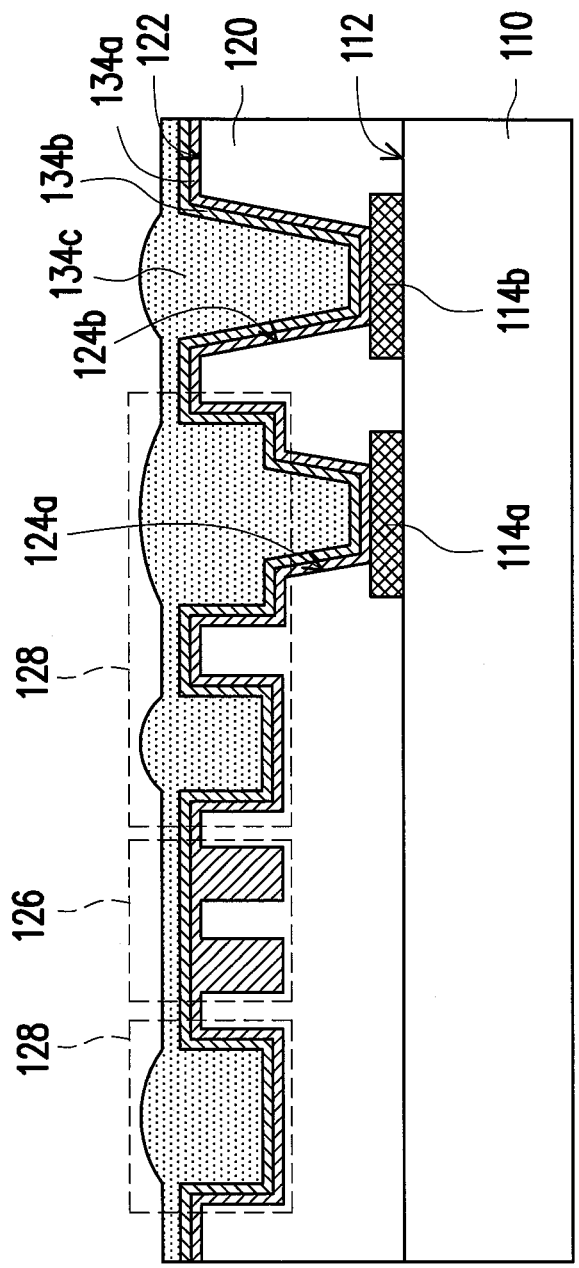

In FIG. 2D, a second conductive layer 134c is formed in the second intaglio pattern 128 and the blind vias 124a and 124b, and the second conductive layer 134c covers the barrier layer 134b. Specifically, the second conductive layer 134c covers the barrier layer 134b and fills the second intaglio pattern 128 and the blind vias 124a and 124b. Additionally, a method of forming the second conductive layer 134c is, for example, performing an electroplating process, and the second conductive layer 134c is, for instance, an electroplated copper layer.

Figure 2E:
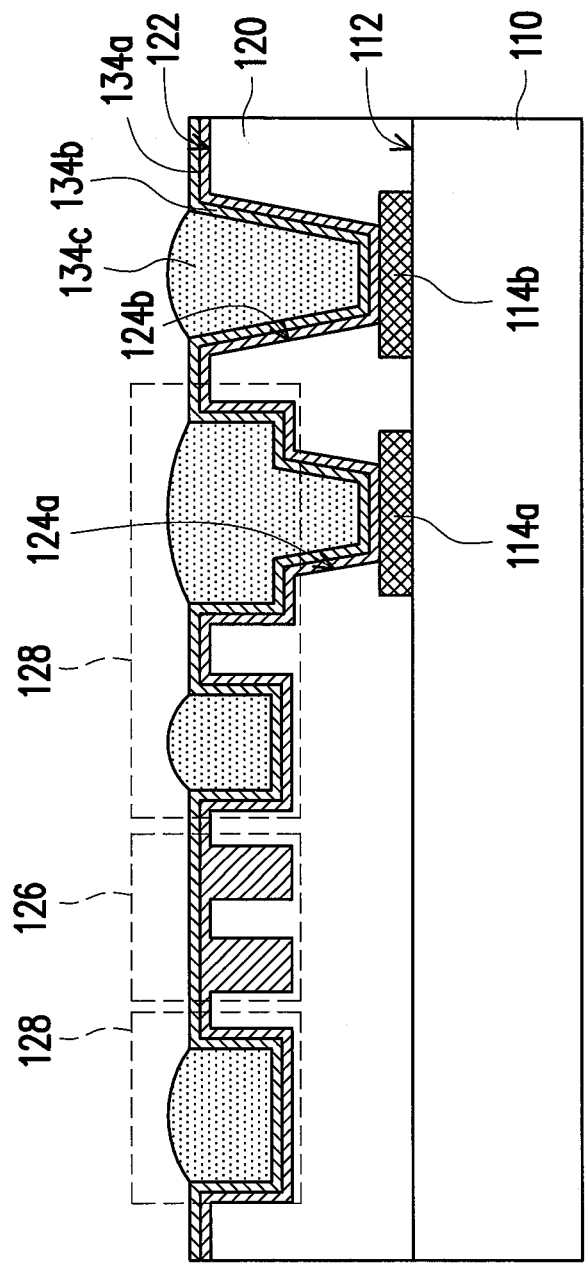

Parts of the second conductive layer 134c, parts of the barrier layer 134b, and parts of the first conductive layer 134a are removed until the second surface 122 of the dielectric layer 120 is exposed to form a patterned circuit structure 130. In detail, according to this embodiment, the step of removing the parts of the second conductive layer 134c, the parts of the barrier layer 134b, and the parts of the first conductive layer 134a is described below. As indicated in FIG. 2E, a first etching process is performed to remove parts of the second conductive layer 134c until the barrier layer 134b is exposed. Here, the barrier layer 134b can act as an etching stop layer for removing the parts of the second conductive layer 134c outside the first intaglio pattern 126, the second intaglio pattern 128, and the blind vias 124a and 124b. Thereby, the etching process can be precisely controlled, so as to prevent excessive or insufficient etching and to ensure favorable manufacturing yield and reliability in the manufacturing method of the circuit board 100 of this embodiment. Moreover, after the first etching process is performed, a polishing process can be performed on the barrier layer 134b to flatten the surface of the barrier layer 134b, which is conducive to the subsequently performed etching processes.

Figure 2F:
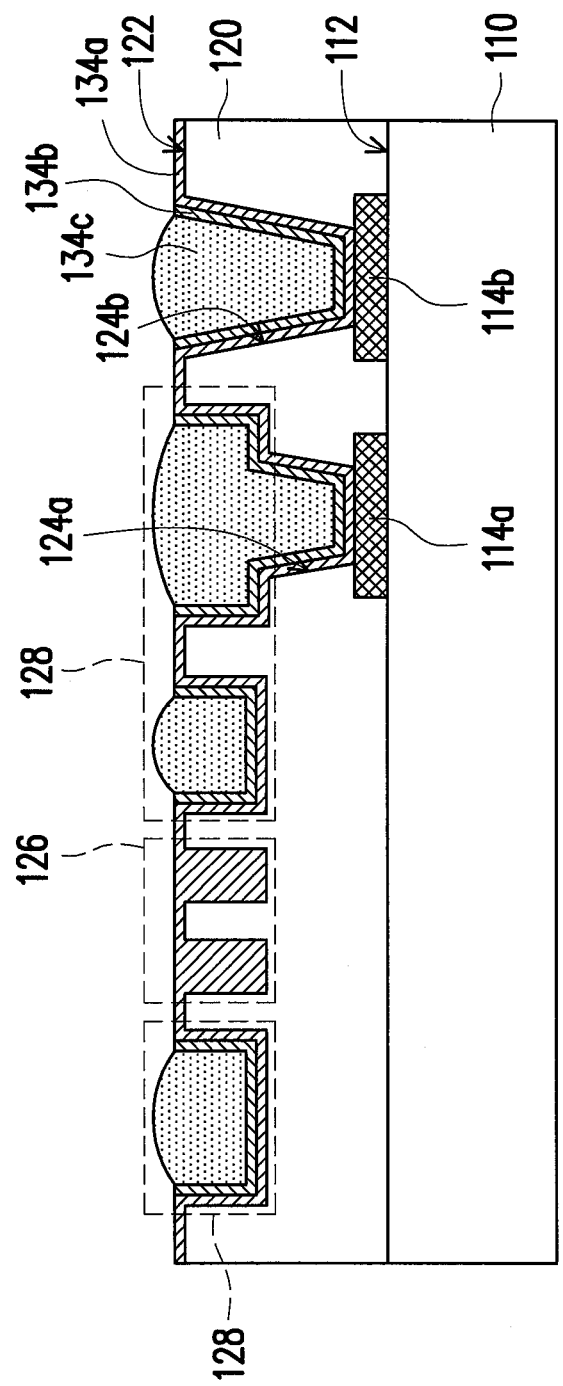

In FIG. 2F, a second etching process is performed to remove parts of the barrier layer 134b outside the second intaglio pattern 128 and the blind vias 124a and 124b until parts of the first conductive layer 134a is exposed. Here, the first conductive layer 134a can act as an etching stop layer for removing the parts of the barrier layer 134b, so as to prevent excessive or insufficient etching and precisely control the etching processes performed on the circuit board 100.

Figure 2G:
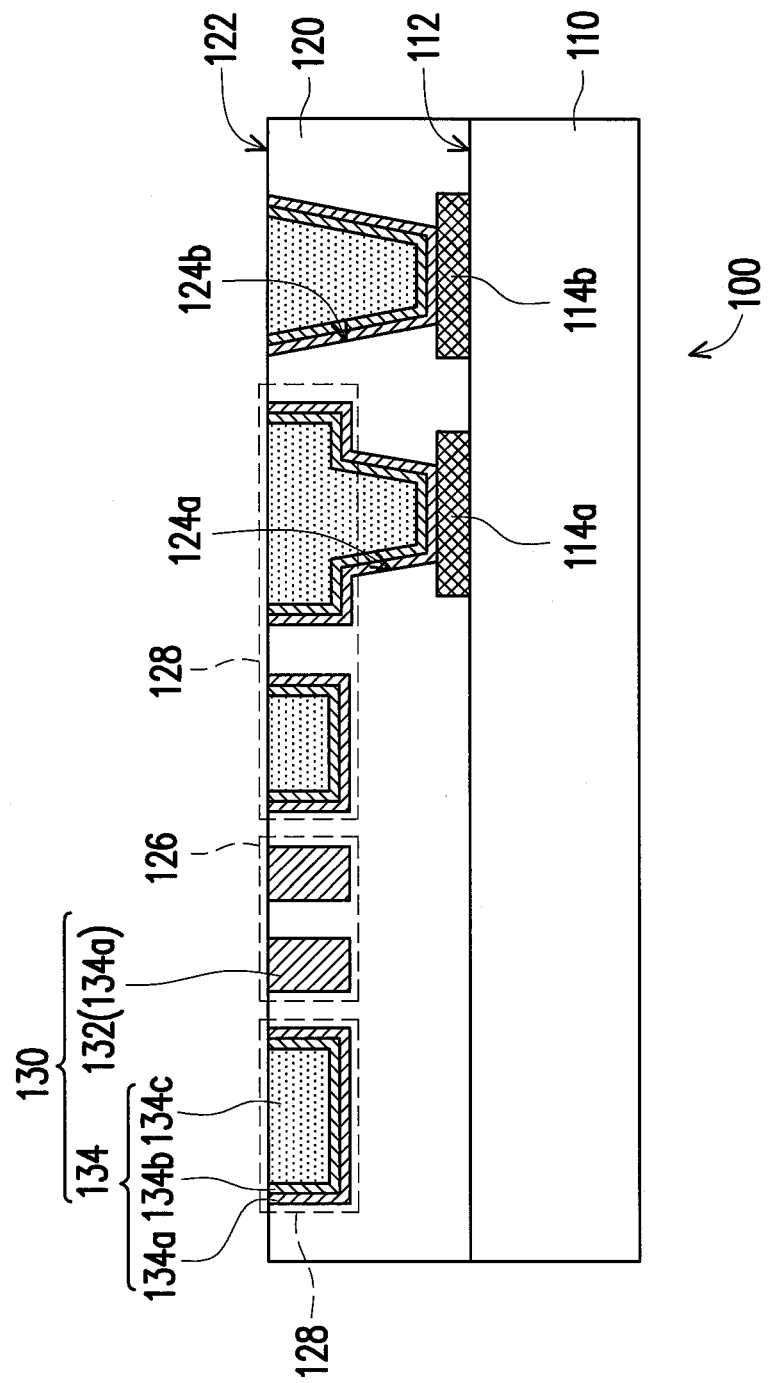

In FIG. 2G, a third etching process is performed to remove parts of the first conductive layer 134a and parts of the second conductive layer 134c until the second surface 122 of the dielectric layer 120 is exposed, so as to form the patterned circuit structure 130.

To be more specific, the patterned circuit structure 130 is located in the first intaglio pattern 126, the second intaglio pattern 128, and the blind vias 124a and 124b. Besides, the patterned circuit structure 130 is electrically connected to the first circuits 114a and 114b of the circuit substrate 110. The patterned circuit structure 130 includes at least a second circuit 132 (two second circuits 132 are schematically illustrated in FIG. 2G) and a plurality of third circuits 134 (four third circuits 134 are schematically illustrated in FIG. 2G). The second circuits 132 are located in the first intaglio pattern 126 and are formed by filling the first intaglio pattern 126 with the first conductive layer 134a. The second circuits 132 and the first surface 122 of the dielectric layer 120 are substantially aligned. Namely, the second circuits 132 are basically embedded circuits. The third circuits 134 are located in the second intaglio pattern 128 and the blind vias 124a and 124b. Here, the third circuits 134 are formed by the first conductive layer 134a, the barrier layer 134b, and the second conductive layer 134c. Note that the third circuits 134 located in the blind via 124a can be electrically connected to the first circuit 114a of the circuit substrate 110, and the third circuits 134 located in the blind via 124b can be electrically connected to the first circuit 114b of the circuit substrate 110. The first conductive layer 134a is located between the barrier layer 134b and the second intaglio pattern 128 and between the barrier layer 134b and the blind vias 124. Besides, the first intaglio pattern 126 is filled with the first conductive layer 134a. That is to say, the second circuits 132 and the first conductive layer 134a of each of the third circuits 134 are in the same film layer. The third circuits 134 and the second surface 122 of the dielectric layer 120 are substantially aligned. Namely, the third circuits 134 are basically embedded circuits.

Particularly, in this embodiment, the line width of the second circuit 132 is shorter than the line width of each of the third circuits 134. That is to say, in comparison with the second circuits 132, the third circuits 134 are normal circuits. By contrast, the second circuits 132 are fine circuits. For instance, the line width of the second circuit 132 is smaller than 15 μm, while the line width of each of the third circuits 134 is greater than the line width of the second circuit 132. In other words, the line width of each of the third circuits 134 is more than 15 μm. So far, the circuit board 100 is completely manufactured.

It should be mentioned although the second circuits 132 embodied herein have the circuit structure with a single conductive layer, the types of the second circuits 132 are not limited in this invention. Nonetheless, in other embodiments that are not depicted in the drawings, the second circuits 132 can also have the circuit structure with three different conductive layers (similar to the circuit structure of the third circuits 134). Namely, the second circuits 132 depicted in FIG. 2G are merely exemplary, which should not be construed as limited to the embodiments of the invention set forth herein. Moreover, note that the second circuits 132 and the third circuits 134 in other embodiments that are not illustrated in the drawings may not be aligned with the second surface 122 of the dielectric layer 120 because of process errors, which should still fall within the scope of the invention and does not depart from the claims of the invention.

In brief, the first conductive layer 134a, the barrier layer 134b, and the second conductive layer 134c are sequentially formed in the first intaglio pattern 126, the second intaglio pattern 128, and the blind vias 124a and 124b according to the embodiment. During the etching processes, the barrier layer 134b can act as the etching stop layer for removing parts of the second conductive layer 134c, and the first conductive layer 134a can act as the etching stop layer for removing parts of the barrier layer 134b. As such, the etching processes can be well monitored in the manufacturing method of the circuit board 100 as described in this embodiment, so as to prevent excessive or insufficient etching. That is to say, the manufacturing method of the circuit board 100 can have favorable manufacturing yield and reliability according to this embodiment.

In light of the foregoing, the first conductive layer is formed in the first intaglio pattern, the second intaglio pattern, and at least a blind via in the invention. The barrier layer and the second conductive layer are sequentially formed in the second intaglio pattern and the blind via, so as to form the circuits with three different conductive layers. Besides, during the etching processes, the barrier layer can act as the etching stop layer for removing parts of the second conductive layer, and the first conductive layer can act as the etching stop layer for removing parts of the barrier layer. As such, the manufacturing method of the circuit board can have favorable manufacturing yield and reliability according to this invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a circuit board, comprising:
   providing a circuit substrate having a first surface and at least a first circuit;
   forming a dielectric layer on the circuit substrate, the dielectric layer having a second surface and covering the first surface and the at least a first circuit;
   irradiating the dielectric layer by a laser beam to form a first intaglio pattern, a second intaglio pattern, and at least a blind via extending from the second surface of the dielectric layer to the at least a first circuit of the circuit substrate;
   forming a first conductive layer in the first intaglio pattern, the second intaglio pattern, and the at least a blind via, wherein the first conductive layer fills the first intaglio pattern and is disposed on an inner wall of the second intaglio pattern and an inner wall of the at least a blind via, and an entire volume of the first intaglio pattern is full of the first conductive layer;
   forming a barrier layer in the second intaglio pattern and the at least a blind via, the barrier layer covering the first conductive layer;
   forming a second conductive layer in the second intaglio pattern and the at least a blind via, the second conductive layer covering the barrier layer; and
   removing parts of the second conductive layer, parts of the barrier layer, and parts of the first conductive layer until the second surface of the dielectric layer is exposed to form a patterned circuit structure, the patterned circuit structure being located in the first intaglio pattern, the second intaglio pattern, and the at least a blind via and being electrically connected to the at least a first circuit of the circuit substrate.

2. The manufacturing method as claimed in claim 1, wherein a material of the dielectric layer comprises polymer.

3. The manufacturing method as claimed in claim 1, wherein the laser beam is an infrared laser source or an ultraviolet laser source.

4. The manufacturing method as claimed in claim 1, wherein a method of forming the first conductive layer comprises performing an electroless plating process.

5. The manufacturing method as claimed in claim 1, wherein a method of forming the barrier layer comprises sputtering or chemical deposition.

6. The manufacturing method as claimed in claim 1, wherein a material of the barrier layer comprises nickel, tin, chromium, aluminum, zinc, or gold.

7. The manufacturing method as claimed in claim 1, wherein a method of forming the second conductive layer comprises performing an electroplating process.

8. The manufacturing method as claimed in claim 1, wherein the patterned circuit structure comprises at least a second circuit and a plurality of third circuits, the at least a second circuit is located in the first intaglio pattern, the third circuits are located in the second intaglio pattern and the at least a blind via, a line width of the at least a second circuit is smaller than a line width of each of the third circuits, and at least one of the third circuits is electrically connected to the at least a first circuit of the circuit substrate.

9. The manufacturing method as claimed in claim 8, wherein before the barrier layer is formed on the first conductive layer, the first intaglio pattern is filled with the first conductive layer to form the at least a second circuit of the patterned circuit structure.

10. The manufacturing method as claimed in claim 1, wherein the step of removing the parts of the second conductive layer, the parts of the barrier layer, and the parts of the first conductive layer comprises:
    performing a first etching process to remove one of the parts of the second conductive layer until the barrier layer is exposed;
    performing a second etching process to remove the parts of the barrier layer until the first conductive layer is exposed; and
    performing a third etching process to remove the parts of the first conductive layer and another one of the parts of the second conductive layer until the second surface of the dielectric layer is exposed.

11. The manufacturing method as claimed in claim 10, further comprising performing a polishing process on the barrier layer before the second etching process is performed.

12. The manufacturing method as claimed in claim 1, wherein the second intaglio pattern and the at least a blind via are connected.

* * * * *